(12) United States Patent
Xu et al.

(10) Patent No.: US 8,334,082 B2
(45) Date of Patent: Dec. 18, 2012

(54) SENSITIVE LIQUID CRYSTALLINE POLYMERIC MATERIAL SUITABLE FOR REFLECTIVE HOLOGRAM RECORDING AND THE PREPARING METHOD THEREOF

(75) Inventors: Liangheng Xu, Shanghai (CN); Yun Gao, Shanghai (CN); Renshun You, Shanghai (CH); Kai Yang, Shanghai (CN); Xuewen Xu, Shanghai (CN)

(73) Assignee: Shanghai Techsun Anti-Counterfeiting Technology Holding Co., Ltd., Shanghai (CN)

( * ) Notice: Subject to any disclaimer, the term of this patent is extended or adjusted under 35 U.S.C. 154(b) by 182 days.

(21) Appl. No.: 13/055,139

(22) PCT Filed: Jul. 29, 2008

(86) PCT No.: PCT/CN2008/071788
§ 371 (c)(1),
(2), (4) Date: Jan. 20, 2011

(87) PCT Pub. No.: WO2010/009592
PCT Pub. Date: Jan. 28, 2010

(65) Prior Publication Data
US 2011/0129764 A1      Jun. 2, 2011

(30) Foreign Application Priority Data
Jul. 21, 2008    (CN) .......................... 2008 1 0040805

(51) Int. Cl.
*G03H 1/02* (2006.01)
(52) U.S. Cl. .................. 430/1; 430/2; 430/281.1; 359/3
(58) Field of Classification Search ........................ None
See application file for complete search history.

(56) References Cited

U.S. PATENT DOCUMENTS

| 3,658,526 | A | 4/1972 | Haugh |
| 4,942,112 | A * | 7/1990 | Monroe et al. ............. 430/282.1 |
| 2006/0057467 | A1 * | 3/2006 | Takizawa ......................... 430/1 |
| 2008/0013138 | A1 * | 1/2008 | Yoshizawa et al. ............... 359/3 |
| 2010/0167180 | A1 | 7/2010 | Xu et al. |

FOREIGN PATENT DOCUMENTS

| CN | 101034257 A | 9/2007 |
| JP | 2004252327 A | 9/2004 |
| JP | 2007131707 A | 5/2007 |
| WO | WO-2010009592 A1 | 1/2010 |

OTHER PUBLICATIONS

Takase et al., "Immobilization of surface relief grating and poled alignment in amorphous azobenzene-containing polymers by photopolymerization", J. Photopoly. Sci., vol. 14(2) pp. 189-192 (2001).*
Fuh et al., "Fast optical recording of polarization holographic grating based on an azo-dye-doped polymer-ball-type polymer-dispersed liquid crystal film", Jpn. J. Apppl. Phys., vol. 42,Pt 1(7A), pp. 4406-4410 (Jul. 2003).*
International Search Report for PCT/CN2008/071788, dated Apr. 30, 2009.

* cited by examiner

*Primary Examiner* — Martin Angebrannt
(74) *Attorney, Agent, or Firm* — Marshall, Gerstein & Borun LLP

(57) ABSTRACT

A sensitive liquid crystalline polymeric material suitable for the reflective hologram recording and the preparing method thereof are disclosed. The material includes a base film, a buffer layer coated on one side of the base film, a sensitive polymeric layer coated on the other side of the buffer layer and a protective layer coated on the surface of the sensitive polymeric layer.

12 Claims, 1 Drawing Sheet

SENSITIVE LIQUID CRYSTALLINE POLYMERIC MATERIAL SUITABLE FOR REFLECTIVE HOLOGRAM RECORDING AND THE PREPARING METHOD THEREOF

TECHNICAL FIELD

The present invention relates to a reflection hologram film and a method for preparing the same.

BACKGROUND ART

The interference fringe of the reflection hologram is different from the rainbow hologram, a majority of which is parallel to the recording medium surface and thus the duplication of images cannot be achieved by the mechanical means, the duplication of images can be achieved only by the optical method. The exhibition of a holographic image is generally achieved by the contrast of the interference fringe. The material for recording the reflection hologram is various, but only fewer is ideal, even less for the scale production. Silver salt and dichromated gelatin as well as photopolymeric material disclosed in the U.S. Pat. No. 3,658,526 are mostly used.

The silver salt has high sensitivity, its exhibition of interference fringe is achieved by the bright-dark contrast of the material after photo-sensitization, but the diffraction efficiency is low, it is only about 40% even if a method of dilution development is adopted.

Dichromated gelatin is currently used as the common material for preparing the reflection hologram, the interference fringe thereof is achieved by the difference of the reflective index, the holographic image produced by dichromated gelatin has high diffraction efficiency as more than 85%, therefore many hologram elements are made of this material. However, it has a lot of shortages, such as low photosensitivity, a short storage life, and photographic plate being currently manufactured for use; at the same time, this material needs wet processing after imaging, the holographic image is affected greatly by the environment and can be easily image-erased in the environment with high moisture.

As to the photopolymeric material, such as the photopolymer in the material disclosed in the U.S. Pat. No. 3,658,526, the exhibition of the interference fringe is achieved by the different reflective indexes of two polymers. Although it can overcome the shortcomings of the silver salt and the dichromated gelatin, it only has the limited visual response to the visible light, which is affected by the resolution, therefore it is limited to be used for the transmission hologram, and, when being used for the reflection hologram, the reflection efficiency is very low.

SUMMARY OF THE INVENTION

An object of the present invention is to disclose a reflection holographic film and a method of preparing the same to overcome the above defects existing in the prior art.

Another object of the present invention is to provide a photosensitive polymeric film which can record the reflection hologram.

Still another object of the present invention is to provide a holographic photosensitive paint for preparing the photosensitive polymeric film material.

The holographic photosensitive paint of the present invention comprises photosensitive polymeric paint and solvent suitable for it, the photosensitive polymeric paint includes the following components in weight percent:

| | |
|---|---|
| film forming agent | 20%-80% |
| azobenzene liquid crystal polymer | 5%-28% |
| polymerizable monomer | 10%-42% |
| photoinitiator | 0.5%-7% |
| photosensitizer | 0.05%-2% |

The solid content of the holographic photosensitive paint is 5%-50% by weight.

| The preferable percentages are as follows: | |
|---|---|
| film forming agent | 30%-70% |
| azobenzene liquid crystal polymer | 6%-25% |
| polymerizable monomer | 12%-38% |
| photoinitiator | 2.0%-7.0% |
| photosensitizer | 0.5%-2.0% |

The film forming agent, the polymerizable monomer and the photoinitiator are the important components, which are used for fixing the structure of the system and coupling azobenzene liquid crystal polymer and the relevant auxiliary agents, and the film forming agent has the important effect on fixing the structure of the material forming the reflection hologram after exposure. The reflective index, the cohesion, the bond force, the flexibility, the miscibility and the like thereof are the important indexes of the materials selected. The film forming agent is selected from the group consisting of poly(methylmethacrylate), poly cellulose acetate butyrate, cellulose acetate butyrate-ethyl vinyl ether copolymer, a blend of polyvinyl butyral and cellulose acetate, polyvinylacetate-butyl acrylate-acrylic acid ternary copolymer, or polystyrene acrylonitrile and the like, or a blend of the above polymers and fluorine-containing polymers, wherein the fluorine-containing polymers are selected from the group consisting of trifluorochloroethylene-acetate vinyl ether copolymer or tetrafluoroethylene-ethyl vinyl ether copolymer.

The polymerizable monomer is selected from the group consisting of acrylic acid, methyl methacrylate, butyl methacrylate, trimethylolpropane triacrylate, diacetone acrylamide, diacrylate of ethoxylated bisphenol A and the like, among which two or more monomers are selected as the polymerizable monomer system, the weight ratio is 1:0.4-0.9.

Preferably, the polymerizable monomer system is a blend of methyl methacrylate and trimethylolpropane triacrylate, the weight ratio is 1:0.5-0.8.

Under irradiation of ultraviolet light, the photoinitiator is to generate free radical for the polymerization crosslinking. The photoinitiator is selected from the group consisting of 2,4,6-triphenyl imidazolyl doublet, dibenzoyl, 2,2-dimethyl-2-phenyl acetophenone and the like, preferably is 2,4,6-triphenyl imidazolyl dimer.

The azobenzene liquid crystal polymer is a kind of azo side-chain polymer. Specifically, azobenzene-methyl acrylate copolymer, or azobenzene-butyl acrylate copolymer. For example: p-aminoazobenzene poly(methyl acrylate) or p-aminoazobenzene poly(butyl acrylate) and the like. Its major function is to enable the molecular arrangement to generate the aberrance accompanying the trans-cis isomerous conversion of the azobenzene under the irradiation of laser light, which causes the change of the reflective index. The azobenzene liquid crystal polymer can be obtained from the side group reaction of (CAS no. 60-09-3) p-aminoazobenzene and poly(methyl acrylate) or poly(butyl acrylate).

The photosensitizer is selected from the group consisting of Erythrosin B, diethylamino-benzylidene cyclopentanone, Michler's ketone or 1,3,3-trimethyl-2-[5-(1,3,3-trimethyl-2-indolidene)-1,3-Pentadiene]indole iodide and the like; its function is to make the sensitive wavelength of the azobenzene polymer to 514.5 nm or longer by adding the photosensitizer because the azobenzene polymer is sensitive in the ultraviolet wave band; the photosensitizer is preferably diethylamino-benzylidene cyclopentanone.

The solvent is a blended solvent of butanone/dichloromethane/methanol, the weight ratio is 4-6:0.5-1.5:0.5-1.5, preferably is 5:1:1.

Preferably, the photosensitive polymeric paint also includes a plasticizer of 0.5-3% and/or an UV absorber of 0.1-1% and/or non-ionic surfactant of 0.1-1% based on the total weight of the photosensitive polymeric paint.

The plasticizer is selected from the group consisting of phthalates, alkyl dioic ester, polyethyleneglycol carboxylic ester or diethyl sebacate; the UV absorber is selected from the group consisting of 2-hydroxyl-4-methoxybenzophenone or 2-(2H-benzotriazole-2)-4,6-di(1-methyl-1-phenylethyl)phenol; the non-ionic surfactant is selected from the group consisting of polyethylene glycol, methoxy polyethylene glycol or fluoric surfactant Fluorad®FC-4430 (CAS No. 108-88-3) manufactured by 3M Corp. for adjusting the coating property.

The photosensitive polymeric film for recording the reflection hologram as described in the present invention comprises a base film, a buffer layer coated on one side of the base film, a photosensitive polymer coating layer formed of the holographic photosensitive paint coated on the other side of the buffer layer and a surface protective film coated on the surface of the photosensitive polymer coating layer; the thickness of the dried photosensitive polymer coating layer is 3-50 μm;

The base film is selected from the group consisting of PVC, PET or BOPP film with a thickness of 20-100 μm;

The buffer layer is a link layer between the photosensitive polymer coating layer and the base film, the buffer layer may be a photo-curing coating layer of vinyl acetate-acrylic ester copolymer, vinylidene chloride-styrene-vinyl acetate copolymer, or acrylic ester and so on. Its reflective index is close to the reflective index of the base film and it has a thickness of 1-2 μm.

The surface protective film may be made of a base material that has a release coating, preferably PET film, BOPP film, PE or PVC film, the thickness of the surface protective film is 16-23 μm. Such PET film, BOPP film, PE or PVC film having a release coating are available in market, for example, PET film product manufactured by Japan's Toray Inc.

In the reflection hologram film of the present invention, the interference fringes of the holographic image or the double color-changing image are recorded on the photosensitive polymer coating layer of the photosensitive polymeric film which can record the reflection hologram;

The preparation method of the reflection hologram film comprises the following steps:

(1) Preparation of the coating material: adding film forming agent, azobenzene liquid crystal polymer, polymerizable monomer, photoinitiator and photosensitizer into a solvent in proportion in the darkness or under the red light, stirring for dissolution to obtain the photosensitive paint A, preferably, simultaneously adding plasticizer, UV absorber and/or surfactant and the like;

(2) Preparation of the photosensitive polymeric film material: coating the buffer layer on the base film, then coating the photosensitive paint obtained in step (1) on the base film on which the buffer layer has been coated in the darkness or under the red light, drying at 65-75° C. for 1-5 minutes, covering with the protective film after drying, then passing through a 0.5-5.0 T magnetic field with a speed of 1-3 m/min at room temperature for the orientation of azobenzene liquid crystal polymer, so as to obtain the photosensitive polymeric film material.

(3) Preparation of the reflection hologram film: uncovering the protective film of the product obtained in step (2), recording a holographic image on the photosensitive polymeric film material B by adopting a reflection hologram recording method, totally subjecting the film to the exposure of the UV and visible light on a UV curing machine, then heating at 120° C. for 2-50 minutes to obtain the reflection hologram film, which is a solid transparent photosensitive film material having a certain flexibility.

The wavelength of the red light should be greater than 600 nm, the purpose of the condition in the darkness or under the red light is to avoid exposure of the photosensitive paint A;

The wavelength of the laser light source is 514.5 nm or 532 nm, the light intensity is 60-110 mw/cm$^2$, the exposure time is 0.1-1.0 s, an argon ion laser (having a wavelength of 514 nm) or a semiconductor solid laser (having a wavelength of 532 nm) may be used as the laser light source;

The laser recording method is a prior art method, for example: Lippmann recording method and Danisyuk method. Those skilled in the art can make reference to such a prior art method.

The photosensitive polymeric film of the present invention is azobenzene liquid crystal polymer, whose molecules are arranged orderly under the action of magnetic field. The reference beam and the object beam of the coherent beam interfere from opposite sides (or same side) radiate into the recording medium. The irradiation of laser causes the arranged molecules to generate trans-cis isomerous conversion and thereby changes the local arrangement state, so that the reflective index of the polymer changes, the holographic image is formed and the holographic image with high diffraction efficiency is obtained. At the same time, the sensitized film is UV-cured, so that the polymerisible monomer is subjected to the crosslinking polymerization to fix this changed structure and achieve the function of a permanent storage of the image.

The present invention employs the optical interference principle to form the alternately bright and dark reflective fringes with a certain wavelength in said holographic photosensitive polymeric material by the above holographic photosensitive polymeric material. The liquid crystal molecules in bright fringe field generate the trans-cis isomerous conversion under the irradiation of laser, the local arrangement state is changed, so that the reflective index of the holographic photosensitive polymeric material changes; but no isomerous conversion occurs in the dark fringe field, and the reflective index of the holographic photosensitive polymeric material does not change. As a result, the holographic image is formed and the holographic image with high diffraction efficiency is obtained. Under the ultraviolet light, the photoinitiator is radiated by the light with the certain energy and the specific wavelength to absorb photons and transits into the excited state to generate a free radical which initiates the monomer polymerization so as to fix the molecular structure of the isomerous arrangement to obtain the holographic image which permanently shows brightness.

As can be seen from the above disclosed technical solution, the holographic photosensitive film of the present invention has a high sensitivity, high reflection efficiency and high reflective index modulation, and presents a long storage life and is little affected by the environment. Different from the conventional wet process treatment method of the photosensitive material, the obtained recording images can achieve the reflective image or the double color-changing image having a reflection efficiency of more than 95% only via the light curing and the thermal enhancement treatment, and is suitable for batch manufacturing process.

SPECIFIC EMBODIMENTS

Figure 1:
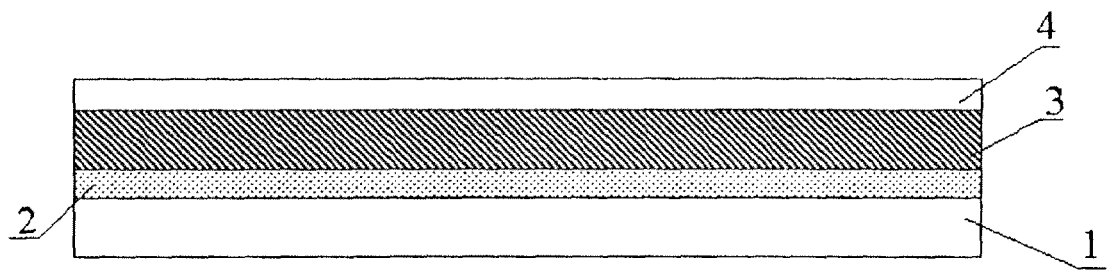
FIG. 1 is a schematic diagram for the structure of the photosensitive polymeric film for hologram recording.

See FIG. 1, the photosensitive polymeric film of the present invention comprises a base film 1 and a buffer layer 2 coated on one side of the base film 1, a photosensitive polymer coating layer 3 formed of the holographic photosensitive paint coated on the other side of the buffer layer 2 and a surface protective film 4 covered on the surface of the photosensitive polymer coating layer; the interference fringe of the holographic image or the double color-changing image can be recorded on the photosensitive polymer coating layer 3.

The present invention is described through Examples as follows, but the Examples are only for the illustrative purpose, the present invention is not limited to them.

EXAMPLE 1

Under the red safe-light with the wavelength of more than 600 nm, 7.6 g (76 wt %) of film forming agent polyvinylacetate-butyl acrylate-acrylic acid ternary copolymer, 0.62 g (6.2 wt %) of p-aminoazobenzene poly(methyl acrylate), 0.73 g (7.3 wt %) of monomer methyl methacrylate, 0.5 g (5 wt %) of monomer trimethylolpropane triacrylate, 0.065 g (0.65 wt %) of photoinitiator 2,4,6-triphenyl imidazolyl dimer, 0.006 g (0.056 wt %) of photosensitizer diethylaminobenzylidene cyclopentanone, 0.017 g (0.17 wt %) of UV absorber 2-hydroxyl-4-methoxybenzophenone, 0.09 g (0.92 wt %) of non-ionic surfactant Fluorad®FC-4430, and 0.28 g (2.8 wt %) of plasticizer diethyl sebacate, were added into a blended solvent (butanone:dichloromethane:methanol=5:1:1, the weight ratio), the solid content was 8% by weight, the resultant mixture was stirred at room temperature to dissolve, the viscosity as measured was 11 cp (25° C.), the resultant product was filtrated to obtain the photosensitive paint for use;

A 50 μm PET film with the high-transparency was used as the base film 1. A solution containing vinylidene chloride-styrene-vinyl acetate copolymer in a concentration of 40 wt % was formulated. The solution was coated on the base film 1 with 120 yarn mesh roller, then dried at 60° C. to obtain a buffer layer 2 with a thickness of 1 μm;

The gap between a scraper and a coating head was adjusted to 200 μm. The above photosensitive polymeric paint was coated on the 50 μm PET film on which the buffer layer 2 had been coated, then dried in a convection oven at 75° C. The resultant coating had a thickness of 10 μm, on which a PET film 4 with a release coating with a thickness of 23 μm was further covered. The resultant product was passed through a 1.0 T magnetic field at a speed of 2 m/min to obtain the photosensitive polymeric film for the hologram recording.

Figure 2:
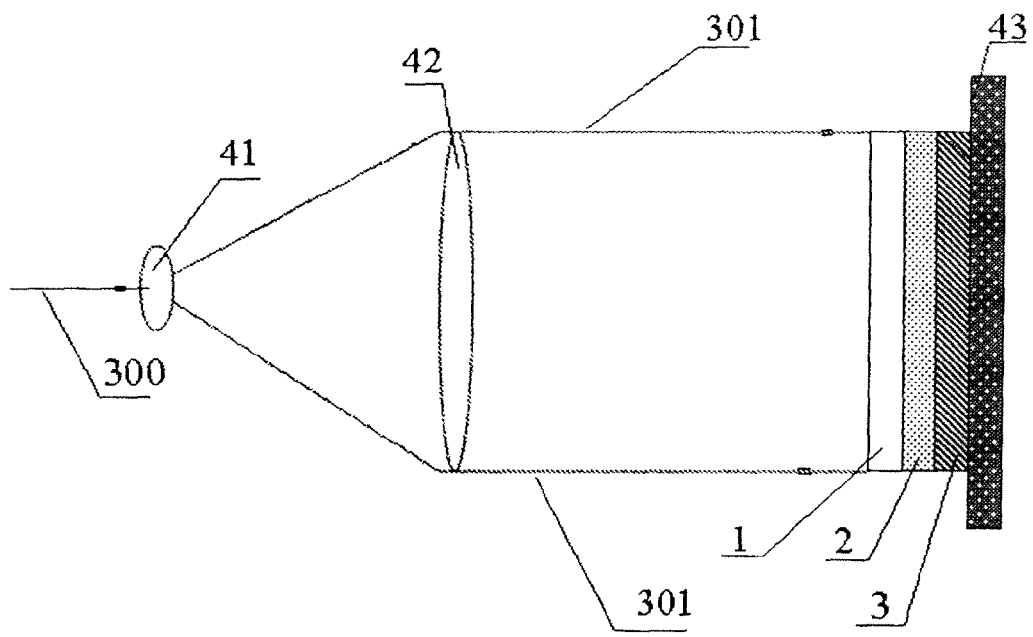
FIG. 2 is a schematic diagram for a laser recording and optical path test on the reflection hologram film.

The preparation of the reflection hologram film:

An "on-line" reflection hologram recording method was adopted. Specifically as shown in FIG. 2, the photosensitive polymeric film for the hologram recording was cut into the sheets of 30*30 mm. After the surface protective film (4) was uncovered, the photosensitive polymeric film was stuck on a reflective mirror 43. A light beam 300 of an argon-ion laser (514 nm) passed through a beam expander 41 with a pin hole filter and an aspheric collimation lens 42 to form a parallel light beam 301 with the light intensity of 60 mw/cm², which then radiated onto the photosensitive polymeric film. The parallel light 301 was incident from the base film 1 and passed through the buffer layer 2 and photosensitive polymer coating layer 3 to reach the reflective mirror 43. The exposure time was 0.1 s, so that the holographic image was recorded in the photosensitive polymeric film for the hologram recording. After that, the film was subjected to the sufficient exposure of the ultraviolet and visible light on a UV-curing machine, and then heated at 120° C. for 2 minutes to obtain the reflection hologram film, which was visually visible as a hologram reflective mirror. This film was a solid transparent film with the certain flexibility.

EXAMPLE 2

Under the red safe-light with the wavelength of more than 600 nm, 3.12 g (26.0 wt %) of film forming agent (which is a blend of polyvinyl butyral and cellulose acetate), 3 g (25 wt %) of p-aminoazobenzene poly(butyl acrylate), 2.9 g (24.2 wt %) of monomer butyl methacrylate, 1.82 g (15.1 wt %) of monomer diacrylate of ethoxylated bisphenol A, 0.79 g (6.6 wt %) of the photoinitiator benzoin isobutyl ether, 0.2 g (1.7 wt %) of photosensitizer Michler's ketone, 0.1 g (0.88 wt %) of UV-absorber 2-hydroxyl-4-methoxybenzophenone, 0.019 g (0.16M %) of nonionic surfactant methoxy polyethylene glycol, and 0.065 g (0.54 wt %) of plasticizer diethyl sebacate, were added into a blended solvent (butanone:dichloromethane:methanol=5:1:1, in weight ratio), the solid content was 46.3% by weight. The resultant mixture was stirred at room temperature to dissolve, the viscosity as measured was 28.3 cp (25° C.), and the resultant product was filtrated to obtain the photosensitive paint for use;

A 36 μm PET film with a high-transparency was selected as the base film 1. A solution containing vinyl acetate-butyl acrylate copolymer in a concentration of 30 wt % was formulated. The solution was coated on the base film 1 with 100 yarn mesh roller, then dried in an oven at 50° C.-70° C. to obtain the base film with a buffer layer 2, the buffer layer with a thickness of 2 μm;

The gap between a scraper and a coating head was adjusted to 180 μm. The above photosensitive paint was coated on the 30 μm PET film on which the buffer layer 2 had been coated, and then dried in a convection oven at 75° C. The resultant coating had a thickness of 8 μm, on which an aluminum-plated PET film with a thickness of 16 μm was further covered. The resultant product was passed through a 1.0 T magnetic field for 3 seconds to obtain an orientated photosensitive polymeric film for the hologram recording.

The reflection hologram recording method was adopted. Specifically as shown in FIG. 2, the photosensitive polymeric film for the hologram recording was cut into the sheets of 30*30 nm. After the surface protective film (4) was uncovered, the photosensitive polymeric film was stuck on a reflective mirror 43. A light source 300 generated by a semiconductor solid laser 532 nm passed through a beam expander 41 with a pin hole filter and an aspheric collimation lens 42 to form a parallel light beam 301 with a light intensity of 100 mw/cm², and then radiated onto the photosensitive polymeric film for the hologram recording. The parallel light 301 was incident from the base film 1 and passed through the buffer layer 2 and photosensitive polymer coating layer 3 to reach the reflective mirror 43 or the aluminum-plated PET film, and was reflected back into the photosensitive layer, the two coherent beams recorded the holographic image in the photosensitive polymeric film for the hologram recording. After that, the film was subjected to the sufficient exposure of the ultraviolet and visible light on a UV-curing machine, and then heated at 120° C. for 2 minutes to obtain the reflection hologram film. The area of the reflective film was 50×50 mm, the light intensity was 100 mw/cm². The reflective film was visually viewed as green at a certain angle. When the angle for observing was changed, it turned into blue.

EXAMPLE 3

The reflection hologram film was evaluated. Specifically, referring to the method of FIG. 2, a holographic-image recording was performed in the photosensitive polymeric film via the coherent light "on-line" recording technique.

The photosensitive polymeric film for the hologram recording was cut into the sheets of 30*30 nm. After the surface protective film (4) was uncovered, the photosensitive polymeric film was stuck evenly on a reflective mirror 43. A laser having a wavelength of 532 nm was used as the light source. A light beam 300 passed through a beam expander 41 with a pin hole filter and an aspheric collimation lens 42 to form a parallel light beam 301, and then radiated onto the photosensitive polymeric film. The parallel light 301 was incident from the base film 1 and passed through the buffer layer 2 and photosensitive polymer coating layer 3 to reach the reflective mirror 43, and was reflected back into the photosensitive polymer coating layer 3 to form a grating. The diameter of the radiation was 15 mm. The reflection gratings were recorded separately at the different recording time under the same light intensity. The recorded material was cured via a high-pressure mercury lamp, and then tested with a S-53 UV-visible spectrophotometer, on assumption that the transmittance of the field where no reflective grating had been found was $I_0$. The minimum transmittance I of the reflective grating at each different exposure time and the wavelength $\lambda$ at this site were tested after the hologram recording. The wavelength obtained was 525 nm. After that, by calculation formula $\eta=1-I/I_0$, the maximum reflection efficiency was calculated as $\eta=95\%$, and the refractive index modulation was calculated to be 0.0521. The test result showed that the reflection efficiency of the material reached 95%. As can be seen, such a dry treatment, in which curing was achieved by optical fixing, could totally meet the requirement of the material. The treated materials were subjected to the acid-alkali treatment and the wetting treatment, respectively, and the images did not fade away.

The invention claimed is:
1. A holographic photosensitive paint, comprising a photosensitive polymeric paint and a suitable solvent, wherein the photosensitive polymeric paint comprises the following components in weight percent:

| | |
|---|---|
| film forming gent | 20%-80% |
| azobenzene liquid crystal polymer | 5%-28% |
| polymerizable monomer | 10%-42% |
| photoinitiator | 0.5%-7% |
| photosensitizer | 0.05%-2% | wherein the solid content of the holographic photosensitive paint is 5%-50% by weight.

2. The holographic photosensitive paint of claim 1, wherein the photosensitive polymeric paint comprises the following components in weight percent:

| | |
|---|---|
| film forming agent | 30%-70% |
| azobenzene liquid crystal polymer | 6%-25% |
| polymerizable monomer | 12%-38% |
| photoinitiator | 2.0%-7.0% |
| photosensitizer | 0.5%-2.0%. |

3. The holographic photosensitive paint of claim 1, wherein the film forming agent is selected from the group consisting of poly(methylmethacrylate), poly cellulose acetate butyrate, cellulose acetate butyrate-ethyl vinyl ether copolymer, a blend of polyvinyl butyral and cellulose acetate, polyvinylacetate-butyl acrylate-acrylic acid ternary copolymer, polystyrene acrylonitrile, and a blend of one or more of the preceding polymers and a fluorine-containing polymer, wherein the fluorine-containing polymer is selected from the group consisting of trifluorochloroethylene-acetate vinyl ether copolymer and tetrafluoroethylene-ethyl vinyl ether copolymer;
the polymerizable monomer is selected from the group consisting of acrylic acid, methyl methacrylate, butyl methacrylate, trimethylolpropane triacrylate, diacetone acrylamide, and diacrylate of ethoxylated bisphenol A; wherein when two or more monomers are selected, the weight ratio is 1:0.4-0.9;
the photoinitiator is selected from the group consisting of 2,4,6-triphenyl imidazolyl dimer, dibenzoyl and 2,2-dimethyl-2-phenyl acetophenone;
the photosensitizer is selected from the group consisting of erythrosin B, diethylamino-benzylidene cyclopentanone, Michler's ketone and 1,3,3-trimethyl-2-[5-(1,3, 3-trimethyl-2-indolidene)-1,3-pentadiene]indole iodide;
the solvent is a blended solvent of butanone/dichloromethane/methanol, the weight ratio of which is 4-6: 0.5-1.5:0.5-1.5.
4. The holographic photosensitive paint of claim 1, wherein the azobenzene liquid crystal polymer is selected from p-aminoazobenzene poly(methyl acrylate) and p-aminoazobenzene poly(butyl acrylate).
5. The holographic photosensitive paint of claim 1, wherein the photosensitive polymeric paint further comprises a plasticizer in an amount of 0.5-3% and/or an UV absorber in an amount of 0.1-1% and/or non-ionic surfactant in an amount of 0.1-1% based on the total weight of the photosensitive polymeric paint;
the plasticizer is selected from the group consisting of phthalates, alkyl dioic ester, polyethyleneglycol carboxylic ester and diethyl sebacate;
the UV absorber is selected from the group consisting of 2-hydroxyl-4-methoxybenzophenone and 2-(2H-benzotriazole-2)-4,6-di(1-methyl-1-phenylethyl)phenol;
the non-ionic surfactant is selected from the group consisting of polyethylene glycol, methoxy polyethylene glycol and fluoric surfactant.
6. A photosensitive polymeric film capable of recording the reflection hologram, comprising a base film, a buffer layer coated on one side of the base film, a photosensitive polymer coating layer formed of the holographic photosensitive paint according to claim 1 coated on the other side of the buffer layer, and a surface protective film covering the surface of the photosensitive polymer coating layer.

7. The photosensitive polymeric film capable of recording the reflection hologram of claim 6, wherein the photosensitive polymer coating layer, after being dried, has a thickness of 3-50 μm.

8. The photosensitive polymeric film capable of recording reflection hologram of claim 6, wherein the base film has a thickness of 20-100 μm and comprises a material selected from the group consisting of PVC, PET and BOPP;

the buffer layer is a link layer between the photosensitive polymer coating layer and the base film, the buffer layer comprising a photo-curing coating layer of vinyl acetate-acrylic ester copolymer, vinylidene chloride-styrene-vinyl acetate copolymer, or acrylic ester, the buffer layer having a reflective index which is substantially the same as that of the base film and the buffer layer having a thickness of 1-2 μm;

the surface protective film is made of a base material that has a release coating, and the thickness of the surface protective film is 16-23 μm.

9. A reflection hologram film, wherein an interference fringe of a holographic image or double color-changing image is recorded in the photosensitive polymer coating layer of the photosensitive polymeric film capable of recording the reflection hologram according to claim 8.

10. A method for preparing the reflection hologram film of claim 9, comprising the following steps:

(1) adding film forming agent, azobenzene liquid crystal polymer, polymerizable monomer, photoinitiator and photosensitizer into a solvent in proportion in darkness or under a red light, and stirring to obtain the photosensitive paint;

(2) coating the buffer layer on a first side of the base film, then coating in darkness or under a red light the photosensitive paint obtained in step (1) on the other side of the base film on which the buffer layer has been coated, drying at 65-75° C. for 1-5 minutes, covering the side of the base film on which the photosensitive paint has been coated with the protective film after drying, then passing through a 0.5-5.0 T magnetic field with a speed of 1-3 m/min at room temperature to orient the azobenzene liquid crystal polymer, so as to obtain the photosensitive polymeric film material; and (3) uncovering the protective film of the product obtained in step (2), recording a holographic image on the photosensitive polymeric film material by a reflection hologram recording method, totally subjecting the film to UV and visible light on a UV-curing machine, and then heating at 120° C. for 2-50 minutes to obtain the reflection hologram film.

11. The method of claim 10, wherein the wavelength of the red light is greater than 600 nm, and the reflection hologram recording method uses a laser light source in which the wavelength of the laser light source is 514.5 nm or 532 nm, the light intensity is 60-110 mw/cm$^2$, and the exposure time is 0.1-1.0 s.

12. The method of claim 10, further comprising simultaneously adding plasticizer and/or UV absorber and/or surfactant in step (1).

* * * * *

UNITED STATES PATENT AND TRADEMARK OFFICE
CERTIFICATE OF CORRECTION

PATENT NO. : 8,334,082 B2  
APPLICATION NO. : 13/055139  
DATED : December 18, 2012  
INVENTOR(S) : Xu et al.

Page 1 of 1

It is certified that error appears in the above-identified patent and that said Letters Patent is hereby corrected as shown below:

In the Claims
In Column 7, Line 60, in Claim 1, please delete "film forming gent" and insert -- film forming agent --, therefor.

Signed and Sealed this
Sixteenth Day of February, 2016

Michelle K. Lee
*Director of the United States Patent and Trademark Office*